United States Patent [19]

Stemple

[11] Patent Number: 4,585,517
[45] Date of Patent: Apr. 29, 1986

[54] REACTIVE SPUTTER CLEANING OF SEMICONDUCTOR WAFER

[75] Inventor: Donald K. Stemple, Tempe, Ariz.

[73] Assignee: Motorola, Inc., Schaumburg, Ill.

[21] Appl. No.: 696,936

[22] Filed: Jan. 31, 1985

[51] Int. Cl.[4] .................. B44C 1/22; C03C 15/00; C23C 15/00; C03C 25/06
[52] U.S. Cl. .................... 156/643; 29/571; 134/1; 156/646; 156/657; 204/192 EC; 204/192 E
[58] Field of Search ......... 134/1; 204/192 EC, 192 E, 204/298; 156/643, 646, 655, 657, 345; 29/571; 357/23 S, 23 SC

[56] References Cited

U.S. PATENT DOCUMENTS

| | | | |
|---|---|---|---|
| 3,479,269 | 11/1969 | Byrnes et al. | 204/192 EC |
| 4,056,642 | 11/1977 | Saxena et al. | 204/192 EC |
| 4,328,080 | 5/1982 | Harris | 204/192 EC |
| 4,488,351 | 12/1984 | Momose | 29/571 X |

*Primary Examiner*—William A. Powell
*Attorney, Agent, or Firm*—Joe E. Barbee

[57] ABSTRACT

A method for cleaning semiconductor wafers prior to the sputter deposition of a metal is disclosed. Introducing a mixture of ninety percent argon and ten percent freon to a sputter deposition system to sputter etch the wafers thereby allowing for the removal of unwanted oxide.

5 Claims, 1 Drawing Figure

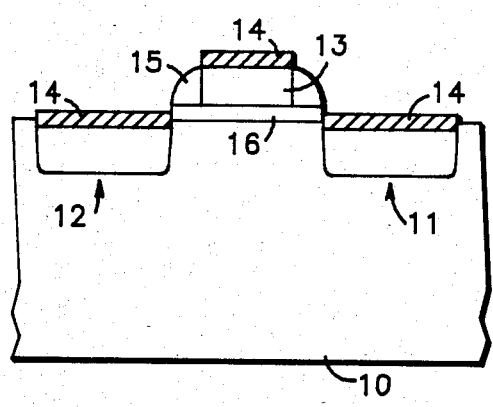

REACTIVE SPUTTER CLEANING OF SEMICONDUCTOR WAFER

BACKGROUND OF THE INVENTION

This invention relates, in general, to semiconductor devices, and more particularly to a method for cleaning semiconductor wafers prior to metal deposition by using a reactive sputter etch.

Semiconductor devices are manufactured on a substrate which is usually made from silicon. The silicon substrate is formed as a wafer, which is subdivided into chips. The chips are usually square or rectangular into which a specific electrical circuit has been fabricated. Each chip may have a single component or a combination and/or a multitude of components. Some examples of the components used are diodes, resistors, capacitors and transistors.

To fabricate the foregoing components requires various process steps, one of which is the deposition of a metal interconnect over the passive and active devices. To provide a good ohmic to metal contact requires that the surface of the devices be cleaned prior to the metal deposition. This is commonly called a metal preclean.

The fabrication steps of a field-effect transistor (F.E.T.) in a self-aligned silicide process are a good example of what can be found in the prior art for a clean prior to metal deposition. Through masking, etching and implanting techniques known in the art, the silicon substrate undergoes a variety of process procedures prior to the formation of the gate and source/drain regions. The gate is formed out of polysilicon and is isolated from below by a thin layer of oxide. The source and drain regions are formed by using photoresist and gate as a mask and implanting dopants into the substrate. Once the source/drain and gate regions are formed, a blanket film of oxide is deposited. This oxide is anisotropically etched by well known means such as using a reactive ion etcher (R.I.E.). Because of the directional nature of the etch all the oxide is removed except for the oxide on the sides of the gate. This "sidewall" oxide is necessary to prevent the gate to source/drain shorting during silicide formation. The thickness of the sidewall oxide also affects the device performance. To form metal contact regions, a metal is sputter deposited over the source/drain and gate regions. In this example, a low contact resistance is desired so the metal deposited is platinum which will later be annealed to form platinum silicide.

Prior to the platinum sputter deposition, a hydrofluoric acid dip and argon sputter etch is provided to remove any residual oxide or native oxide from the source/drain and gate regions. If the oxide is not removed from these areas, a platinum silicide will not form. Moreover, if the devices are placed in the hydrofluoric acid dip for extended periods of time the sidewall oxide will be etched away. In both cases the devices would be rejected. In addition, to use the argon sputter etch by itself would take a considerable length of time, thus being impractical.

Therefore, the foregoing process was found to have problems in the use of a hydrofluoric acid dip and argon sputter etch prior to the sputter deposition of a metal.

SUMMARY OF THE INVENTION

Accordingly, it is an object of the present invention to provide a method for improving the yield in the manufacturing of semiconductor wafers.

Another object of this invention is to decrease or eliminate rejected devices related to the overetching of sidewall oxide by a metal preclean.

It is an additional object to provide a new or improved cleaning procedure by eliminating hydrofluoric acid, or a similar wet etch, from the cleaning procedure of a metal preclean.

A further object of this invention is to decrease or eliminate rejected devices related to native oxide or residual oxide left prior to metal deposition.

A further object is to permit use of thin oxide sidewalls which improve device performance.

A still further object is to perform a metal preclean and a metal deposition in the same sputtering system.

The foregoing and other objects and advantages are achieved in the present invention which, as part thereof, makes use of a reactive sputter clean in which a mixture of freon ($CF_4$) and argon are added to a typical sputter deposition system, activating the sputter system and etching residual oxide from select regions on a semiconductor wafer, stopping the flow of the freon to the sputter system after a predetermined time, and sputter depositing a metal on the semiconductor wafer.

The features and advantages of the invention will be apparent from the following, more detailed description of the preferred embodiment of the invention taken in conjunction with the accompanying drawings.

BRIEF DESCRIPTION OF THE DRAWINGS

The single FIGURE is an enlarged sectional view illustrating a portion of a semiconductor device fabricated in accordance with the present invention.

DETAILED DESCRIPTION OF THE INVENTION

The sectional view of the single FIGURE represents a portion of a semiconductor device. The thickness shown herein is selected for clarity of illustrating and is not to be interpreted in a limiting sense. Also, for purposes of simplicity, the photolithography and etch steps have not been included since these are well known by those skilled in the art.

The single FIGURE represents a portion of an integrated circuit which is formed in accordance with the teachings of the present invention. For purposes of simplicity, the drawing shows a substrate 10 which contains active and passive components that are not shown. Silicon oxide 16 of approximately 150 Angstroms thick is deposited on silicon substrate 10. A polysilicon layer of a thickness of 4000 Angstroms is deposited on top of silicon oxide 16. The polysilicon layer is then formed into polysilicon gate 13 by known masking and etching techniques. Silicon oxide 16 is used to isolate polysilicon gate 13 from components located in silicon substrate 10. The source 12 and drain 11 regions are formed by using photoresist and gate 13 as a mask and implanting a doped material into substrate 10. The implant material could be arsenic if an N-type source/drain is desired or boron if P-type is desired.

A blanket layer of silicon oxide is deposited on top of the source 12, drain 11, and gate 13 regions to a thickness of 1000 Angstroms. Using a reactive ion etcher, the silicon oxide is removed from the horizontal surfaces and left in place on the vertical sidewalls of polysilicon gate 13. The thickness of oxide sidewall 15 is in the order of 1000 Angstroms. After sidewall 15 is formed, a layer of metal is deposited over the source/drain and gate regions.

Prior to the deposition of a layer of metal, in this case platinum, the surface areas of the source 12, drain 11, and gate 13 regions are cleaned of any residual or native oxide that may be present. The existence of oxide in these regions will prevent the formation of platinum silicide which will serve as conductive contacts. The metal preclean used in this embodiment makes use of a mixture of ninety percent argon and ten percent freon gases along with the sputter etch capabilities of the sputter deposition system. In this example, a Sputter Films Incorporated (S.F.I.) sputter deposition system is used. At the completion of the sputter etch cleaning, the atmosphere is changed to pure argon and a layer of platinum is deposited to a thickness of 500 Angstroms. Both the sputter etch and the platinum deposition are performed in the same sputter system.

To form platinum silicide 14, the wafers are placed in a 450 degree centigrade furnace with a nitrogen atmosphere for 25 minutes followed by the addition of oxygen to the nitrogen for another 25 minutes. Unreacted platinum is then removed using a wet etch.

In the prior art the metal preclean used a two step process in which the semiconductor wafers were dipped in a hydrofluoric acid solution and then placed in the sputter system for an argon sputter etch. It was found that the hydrofluoric acid dip etched away part of oxide sidewall 15, which in turn created shorts between gate 13 and other active regions. When eliminating the hydrofluoric acid step from the preclean process, it was found that the argon sputter etch by itself was not enough to clear the residual oxide unless the duration of the sputter etch was increased to an impractical length of time.

Using the mixture of argon and freon ($CF_4$, also known as freon 14) in the sputter etch, created numerous advantages over the prior art. The metal preclean process went from a two step process to a one step process. The one step process is performed in the same piece of equipment that also deposited the metal. This insures that native oxide is not allowed to grow in the source 12, drain 11, and gate 13 regions between metal preclean and metallization. The etch characteristics of the argon/freon sputter etch are similar to that of a reactive ion etcher, in which, oxide on the horizontal surfaces are etched away without substantially etching the vertical surfaces of gate 13, which in this case would be oxide sidewall 15.

Thus it is apparent that there has been provided a method for the cleaning of semiconductor wafers prior to the sputter deposition of a metal. This is accomplished through the use of a typical sputter system with sputter etch capabilities, and the mixture of argon and freon gases which are injected into the sputter system. The addition of freon to the argon gas insures the complete removal of any unwanted oxide plus the added advantage of which the clean and deposition steps are performed in the same piece of equipment while under a vacuum.

What is claimed is:

1. A method for a reactive sputter clean followed by a sputter deposition of a metal on a semiconductor wafer, comprising the steps of;

loading the semiconductor wafer into a sputter deposition system containing an argon atmosphere;

adding a $CF_4$ gas to the argon atmosphere; activating the sputter system and etching the residual oxide from select regions on the semiconductor wafer;

stopping the flow of $CF_4$ to the sputter system after a predetermined time while maintaining the argon atmosphere; and sputter depositing a metal on the semiconductor wafer.

2. The method as defined in claim 1 in which the $CF_4$ gas is ten percent of the argon/$CF_4$ mixture.

3. The method as defined in claim 1 in which the etching of residual oxide and the sputter depositing of metal are performed in the same sputter system.

4. A method of removing oxide from the surface of a semiconductor wafer comprising: placing the wafer in a sputter system; and reactive sputter cleaning the wafer with a mixture of argon and $CF_4$.

5. A method of cleaning a surface of a semiconductor wafer in a sputtering system wherein metallization is also performed, comprising: using a mxiture of $CF_4$ and argon to sputter etch the surface of the semiconductor wafer.

* * * * *